United States Patent
Tang et al.

(10) Patent No.: US 11,114,609 B2
(45) Date of Patent: Sep. 7, 2021

(54) TUNNEL MAGNETORESISTIVE EFFECT ELEMENT, MAGNETIC MEMORY, AND BUILT-IN MEMORY

(71) Applicant: TDK CORPORATION, Tokyo (JP)

(72) Inventors: Zhenyao Tang, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/082,913

(22) PCT Filed: Nov. 8, 2017

(86) PCT No.: PCT/JP2017/040294
§ 371 (c)(1),
(2) Date: Sep. 6, 2018

(87) PCT Pub. No.: WO2019/092817
PCT Pub. Date: May 16, 2019

(65) Prior Publication Data
US 2019/0214549 A1 Jul. 11, 2019

(51) Int. Cl.
*H01L 43/08* (2006.01)
*G11C 11/16* (2006.01)
(Continued)

(52) U.S. Cl.
CPC ............ *H01L 43/08* (2013.01); *G11C 11/161* (2013.01); *H01L 27/1222* (2013.01);
(Continued)

(58) Field of Classification Search
CPC ..... H01L 27/228; H01L 27/222; H01L 43/12; H01L 45/1253; H01L 43/10; G11C 11/16; G11C 11/161
See application file for complete search history.

(56) References Cited

U.S. PATENT DOCUMENTS 6,392,922 B1 5/2002 Liu et al.
6,771,534 B2 8/2004 Stipe
(Continued)

FOREIGN PATENT DOCUMENTS

JP 2008-181580 A 8/2008
JP 5586028 B2 9/2014
(Continued)

OTHER PUBLICATIONS

May 22, 2020 International Preliminary Report on Patentability issued in International Patent Application No. PCT/JP2017/040294.

*Primary Examiner* — Sarah K Salerno
(74) *Attorney, Agent, or Firm* — Oliff PLC

(57) ABSTRACT

A TMR element includes a magnetic tunnel junction, a side wall portion that is disposed on a side surface of the magnetic tunnel junction, a cap layer that covers a top surface of the magnetic tunnel junction and a surface of the side wall portion, and an upper electrode layer that is disposed on the cap layer. The cap layer includes an upper surface and a lower surface. The upper surface has a protruding shape that protrudes in a direction away from the magnetic tunnel junction in a first region which is positioned immediately above the top surface of the magnetic tunnel junction. The upper surface has a recess that is recessed in a direction toward the side wall portion in a second region which is positioned immediately above the surface of the side wall portion.

20 Claims, 9 Drawing Sheets

(51) Int. Cl.
*H01L 27/12* (2006.01)
*H01L 27/22* (2006.01)
*H01L 43/10* (2006.01)
*H01L 43/02* (2006.01)

(52) U.S. Cl.
CPC ............ *H01L 27/228* (2013.01); *H01L 43/10* (2013.01); *H01L 43/02* (2013.01)

(56) References Cited

U.S. PATENT DOCUMENTS

| | | |
|---|---|---|
| 7,477,567 B2 | 1/2009 | Abraham et al. |
| 8,422,276 B2 | 4/2013 | Yuan et al. |
| 8,542,524 B2 | 9/2013 | Keshtbod et al. |
| 8,670,218 B1 * | 3/2014 | Zeltser ................. G11B 5/3909 360/324.2 |
| 8,994,131 B2 | 3/2015 | Shimomura et al. |
| 2006/0022286 A1 * | 2/2006 | Leuschner .............. H01L 43/12 257/421 |
| 2007/0264728 A1 * | 11/2007 | Miura .................... B82Y 25/00 438/3 |
| 2010/0102406 A1 | 4/2010 | Xi et al. |
| 2011/0180888 A1 | 7/2011 | Xi et al. |
| 2012/0091548 A1 | 4/2012 | Sukegawa et al. |
| 2013/0207112 A1 * | 8/2013 | Isobe ................ H01L 29/78693 257/57 |
| 2013/0221461 A1 | 8/2013 | Sukegawa et al. |
| 2019/0131516 A1 * | 5/2019 | Park ........................ H01L 43/02 |

FOREIGN PATENT DOCUMENTS

| | | |
|---|---|---|
| JP | 2015-156501 A | 8/2015 |
| JP | 5988019 B2 | 9/2016 |
| JP | 2017-183560 A | 10/2017 |

* cited by examiner

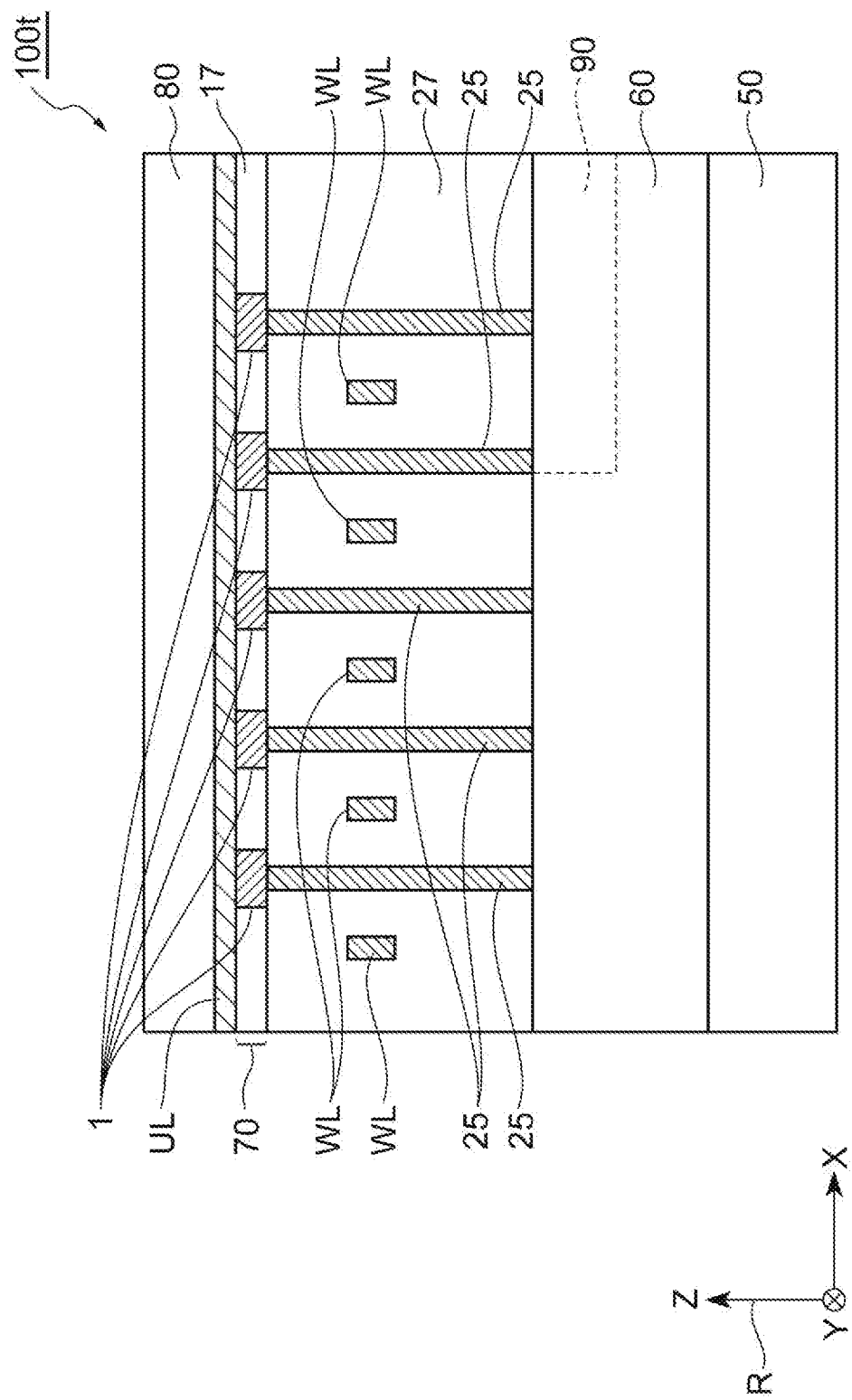

TUNNEL MAGNETORESISTIVE EFFECT ELEMENT, MAGNETIC MEMORY, AND BUILT-IN MEMORY

TECHNICAL FIELD

The present disclosure relates to a tunnel magnetoresistive effect element, a magnetic memory, and a built-in memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize high magnetoresistance (MR ratio), compared to the GMR element that uses a conductive layer as the non-magnetic spacer layer. Thus, the TMR element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element (for example, Patent Literatures 3 and 4 below). When the STT technology is used in the TMR element, an interconnect for magnetic field generation for reversing the magnetization direction of the magnetization free layer is not necessary. In addition, the magnetization of the magnetization free layer can be efficiently reversed from the viewpoint of electrical energy.

In the TMR element, a cap layer is disposed between the magnetic tunnel junction and an upper electrode layer. The cap layer electrically connects the magnetic tunnel junction to the upper electrode, and suppresses migration (movement) of a metal chemical element included in the upper electrode layer, for example, a metal chemical element such as Al or Cu, to the magnetic tunnel junction. For example, the cap layer includes a material such as Ta, TaN, Ti, or TiN (for example, Patent Literature 5 below).

CITATION LIST

Patent Literature

[Patent Literature 1] Japanese Patent No. 5586028
[Patent Literature 2] Japanese Patent No. 5988019
[Patent Literature 3] Japanese Unexamined Patent Publication No. 2015-156501
[Patent Literature 4] U.S. Pat. No. 8,994,131
[Patent Literature 5] U.S. Pat. No. 8,422,276

SUMMARY

However, when the upper surface of the cap layer includes a recess on the top surface of the magnetic tunnel junction, an electric field may be concentrated in the recess, and an electric field may be concentrated in the magnetic tunnel junction that is positioned immediately below the recess. For example, the concentration of the electric field causes the metal chemical element included in the upper electrode layer to be subjected to migration caused by a high electric field. The migration is a cause of an electrical short in the magnetic tunnel junction. Consequently, the reliability of the TMR element is decreased. Further improvement for suppressing the migration of the metal chemical element to the magnetic tunnel junction is desired.

The present disclosure is conceived in view of the above problem. An object of the present disclosure is to provide a TMR element that can suppress migration of a metal chemical element to a magnetic tunnel junction. In addition, an object of the present disclosure is to provide a magnetic memory that includes the TMR element, and a built-in memory that includes the magnetic memory.

In order to resolve the above problem, a tunnel magnetoresistive effect (TMR) element according to one aspect of the present disclosure includes a magnetic tunnel junction, a side wall portion that is disposed on a side surface of the magnetic tunnel junction, a cap layer that covers a top surface of the magnetic tunnel junction and a surface of the side wall portion, and an upper electrode layer that is disposed on the cap layer. The cap layer includes an upper surface and a lower surface. The upper surface has a protruding shape that protrudes in a direction away from the magnetic tunnel junction in a first region which is positioned immediately above the top surface of the magnetic tunnel junction. The upper surface has a recess that is recessed in a direction toward the side wall portion in a second region which is positioned immediately above the surface of the side wall portion. In the second region, the lower surface has a part in which a height of the lower surface is greater than the height of the lower surface in the first region. A height of the upper surface in the first region is greater than the height of the lower surface in the second region. The cap layer includes a migration preventing layer.

In the TMR element according to one aspect of the present disclosure, the upper surface of the cap layer has the recess that is recessed in the direction toward the side wall portion in the second region. While an electric field is easily concentrated in the recess, the recess is present in a position away from the first region that is positioned immediately above the top surface of the magnetic tunnel junction. Thus, an electric field is not easily concentrated in the magnetic tunnel junction, and a metal chemical element such as Al or Cu included in the upper electrode layer is not easily subjected to migration caused by a high electric field. The operation of the TMR element according to one aspect of the present disclosure can stably continue for a long period. In addition, the height of the upper surface of the cap layer 1 in the first region is greater than the height of the lower surface of the cap layer in the second region. The difference between the height of the upper surface and the height of the lower surface can cause the cap layer in the first region to have a thickness that can suppress the migration of the chemical element constituting the upper electrode layer to the magnetic tunnel junction.

In the TMR element according to one aspect of the present disclosure, a thickness of the cap layer in the first region may be greater than that of the cap layer in the second region. In the TMR element, the cap layer in the first region can have a thickness that can further suppress the migration of the chemical element constituting the upper electrode layer to the magnetic tunnel junction.

In the TMR element according to one aspect of the present disclosure, the migration preventing layer may include a heavy metal of atomic number 39 or greater. In the TMR element, since the migration of the heavy metal does not easily occur, the cap layer can suppress the migration of the chemical element constituting the upper electrode layer to the magnetic tunnel junction, and can reduce the migration of the chemical element included in the cap layer to the magnetic tunnel junction.

In the TMR element according to one aspect of the present disclosure, the cap layer may further include a sublayer. The sublayer may form a stack body with the migration preventing layer. The sublayer may be in contact with the magnetic tunnel junction. The migration preventing layer may be in contact with the upper electrode layer. In the TMR element, since the migration preventing layer is in contact with the upper electrode layer, the migration preventing layer causes the cap layer to suppress the migration of the chemical element constituting the upper electrode layer to the magnetic tunnel junction. In addition to this suppression, since the sublayer is in contact with the magnetic tunnel junction, the cap layer is electrically connected to the magnetic tunnel junction.

In the TMR element according to one aspect of the present disclosure, the cap layer may include a plurality of the stack bodies. One sublayer included in the stack bodies may be in contact with the magnetic tunnel junction. One migration preventing layer included in the stack bodies may be in contact with the upper electrode layer. In the TMR element, the plurality of stack bodies further suppress the migration of the chemical element constituting the upper electrode layer to the magnetic tunnel junction, and electrically connect the cap layer to the magnetic tunnel junction.

In the TMR element according to one aspect of the present disclosure the sublayer may include Ta. In the TMR element, since the sublayer including Ta is in contact with the magnetic tunnel junction, the cap layer further suppresses the migration of the chemical element constituting the upper electrode layer to the magnetic tunnel junction, and further reduces the migration of the chemical element included in the cap layer to the magnetic tunnel junction.

In the TMR element according to one aspect of the present disclosure, the upper electrode layer may include a heavy metal of atomic number 39 or greater. In the TMR element, since the migration of the heavy metal does not easily occur, the migration of the chemical element constituting the upper electrode layer to the magnetic tunnel junction is further suppressed.

In addition, a magnetic memory according to one aspect of the present disclosure includes any of the above-mentioned TMR elements as a storage element.

In addition, a built-in memory according to one aspect of the present disclosure includes the magnetic memory.

According to the present disclosure, a TMR element that can suppress migration of a metal chemical element to a magnetic tunnel junction is provided. In addition, a magnetic memory that includes the TMR element, and a built-in memory that includes the magnetic memory are provided.

BRIEF DESCRIPTION OF DRAWINGS

FIG. 9 is a schematic view of a vertical cross-section of an MRAM according to a sixth embodiment.

DESCRIPTION OF EMBODIMENTS

Figure 1:
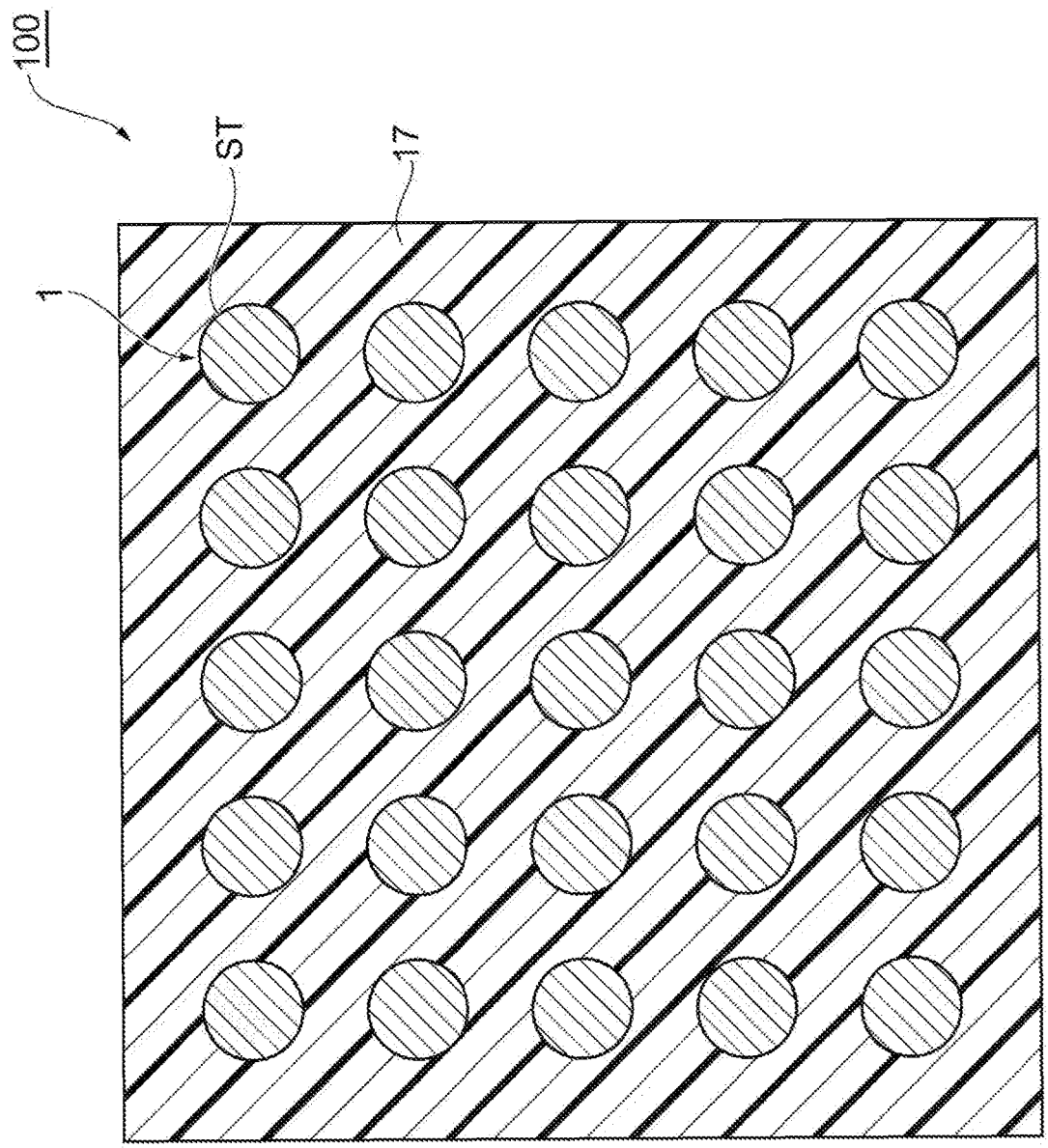
FIG. 1 is a cross-sectional plan view of an MRAM that includes a TMR element of a first embodiment.

Hereinafter, embodiments of the present disclosure will be described in detail with reference to the appended drawings. In each drawing, the same reference signs are used for the same elements if possible. In addition, the ratio of dimensions in constituents and among constituents in the drawings is set for convenience for easy understanding of the drawings.

First Embodiment

Figure 2:
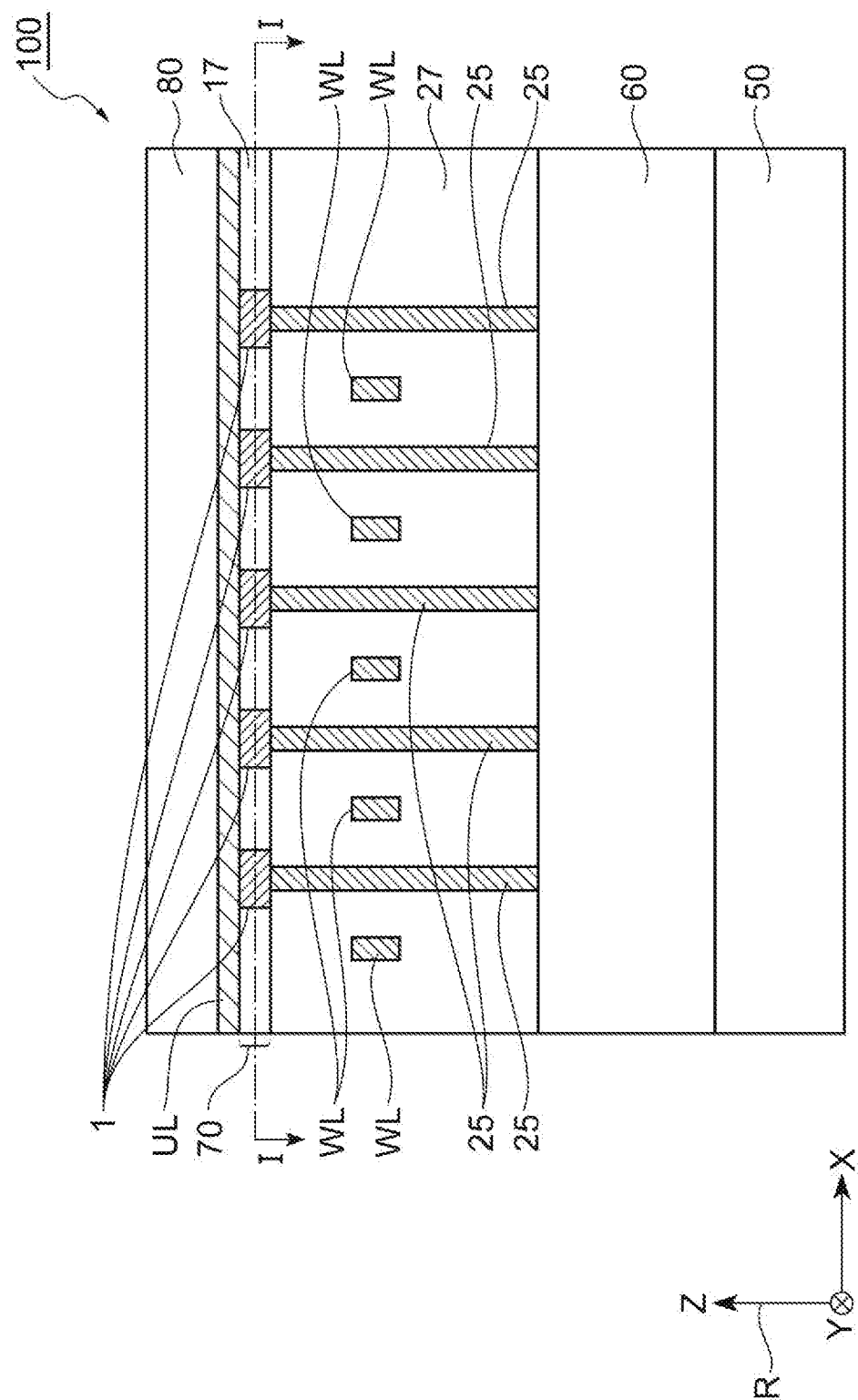
FIG. 2 is a schematic view of a vertical cross-section of the MRAM according to the first embodiment.

FIG. 1 is a cross-sectional plan view of a magnetic memory (magnetoresistive random access memory; MRAM) that includes a perpendicular magnetization tunnel magnetoresistive effect element (TMR element) according to a first embodiment. FIG. 2 is a schematic view of a vertical cross-section of the MRAM according to the first embodiment. FIG. 1 corresponds to a cross-section of an MRAM 100 taken along line I-I in FIG. 2. A three-dimensional orthogonal coordinate system R is illustrated in FIG. 1 and the subsequent drawings when necessary. When the three-dimensional orthogonal coordinate system R is used, the thickness direction of each layer is set along a Z-axis direction, and two orthogonal axes that are perpendicular to the Z axis are set along an X axis and a Y axis.

As illustrated in FIG. 1, the MRAM 100 of the first embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion ST and a side wall portion 17 in which the stack portion ST is embedded. In addition, as illustrated in FIG. 2, the MRAM 100 includes a semiconductor substrate 50, a transistor array 60, a via interconnect part 25, an interlayer insulation layer 27, a word line WL, a TMR element array 70 including the side wall portion 17, an upper interconnect UL, and an insulation body 80 that covers the upper surface of the upper interconnect UL. In FIG. 1 and FIG. 2, other electrical interconnects that connect the upper interconnect UL to the transistor array 60 are not illustrated except the word line WL.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
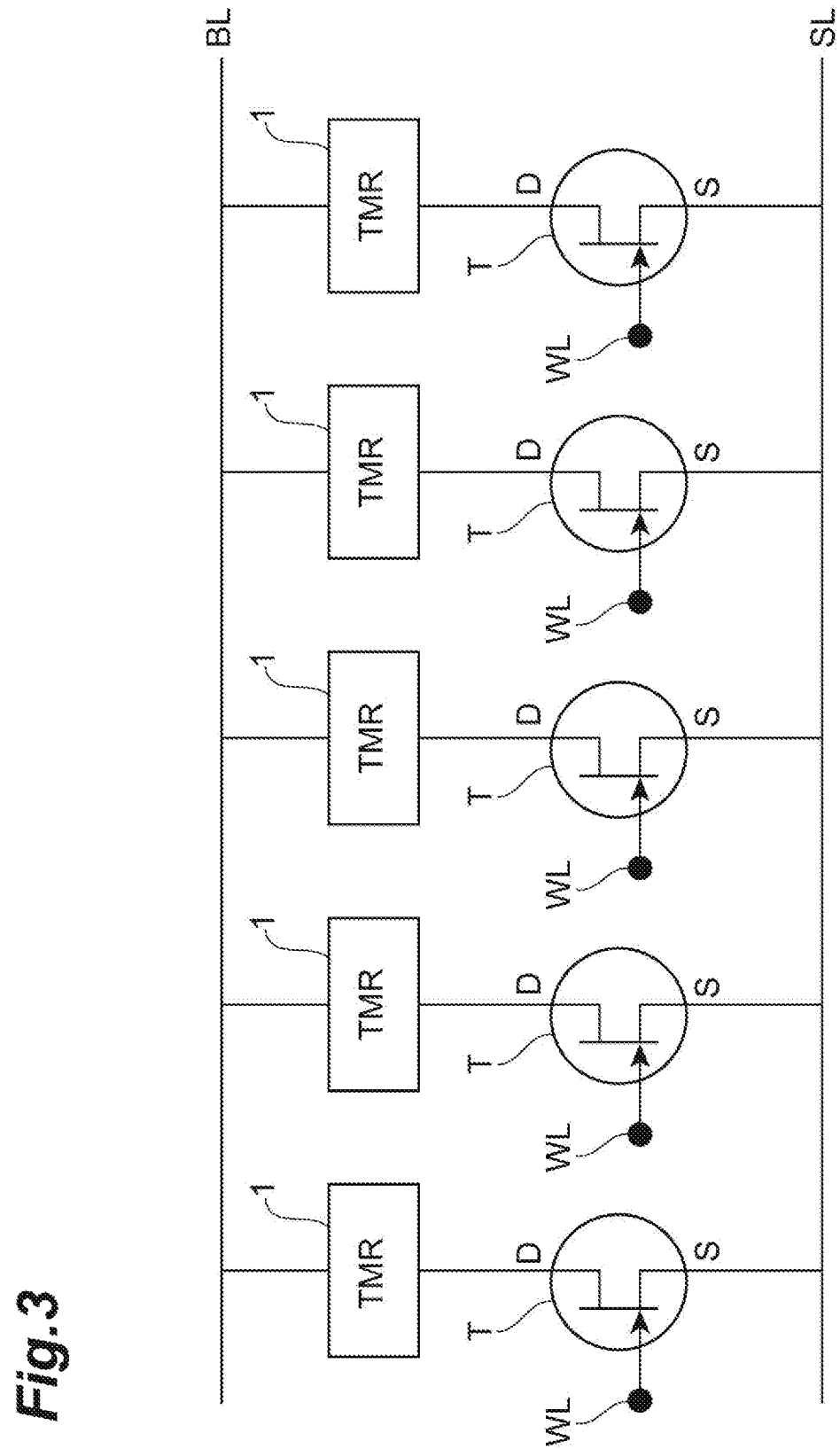
FIG. 3 is a view illustrating the electrical connection of the MRAM of the first embodiment.

FIG. 3 is a view illustrating the electrical connection of the MRAM of the first embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain D of each transistor T, respectively. The other end of each TMR element 1 is electrically connected to a bit line BL. The bit line BL is included in the upper interconnect UL (refer to FIG. 2). The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cells of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
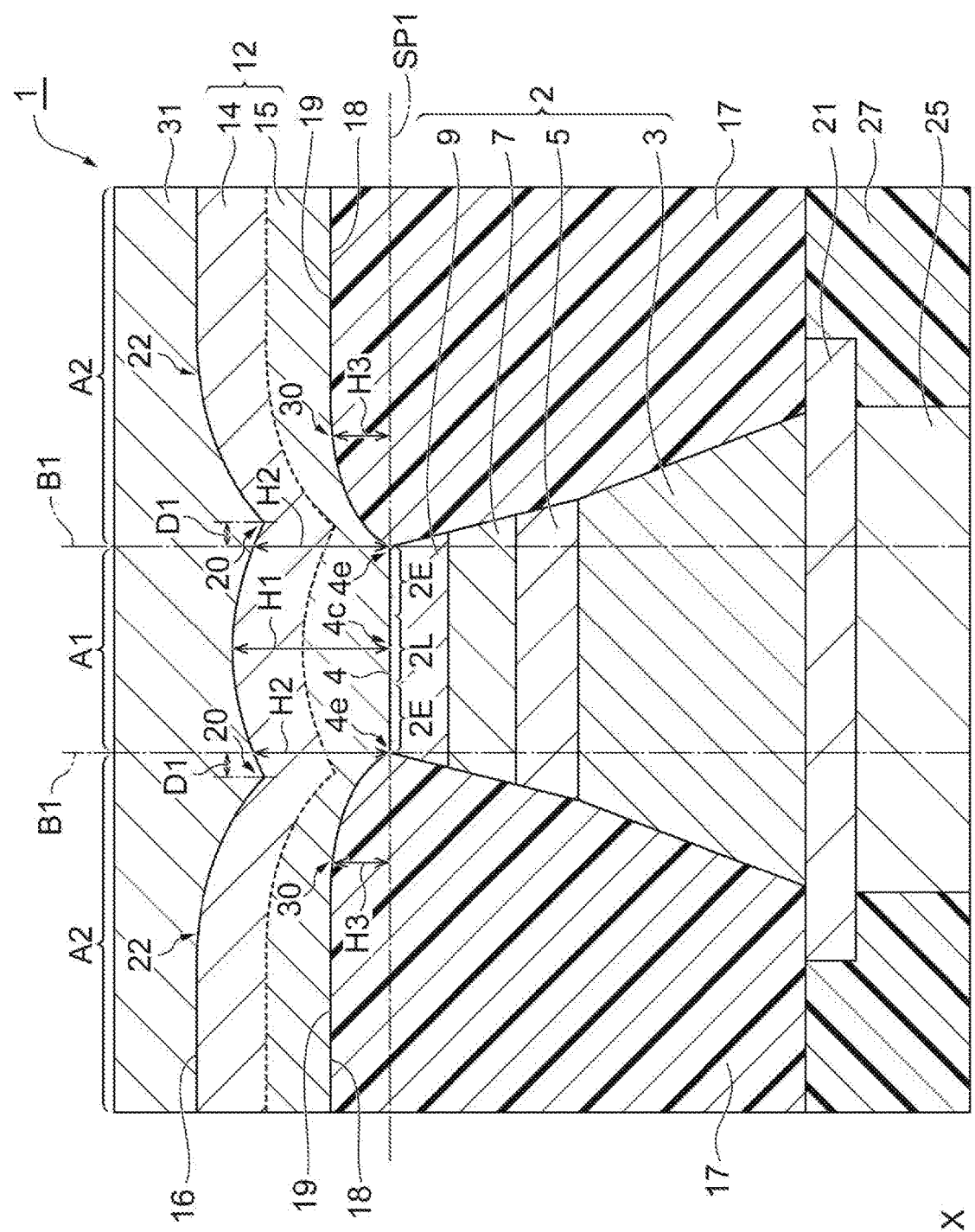
FIG. 4 is a cross-sectional view in the vicinity of the TMR element of the MRAM of the first embodiment.

Next, a detailed configuration of each TMR element 1 of the first embodiment will be described. FIG. 4 is a cross-sectional view in the vicinity of the TMR element of the MRAM of the first embodiment. FIG. 4 illustrates a cross-section in the vicinity of one TMR element 1 in the vertical cross-section of the MRAM 100 illustrated in FIG. 2.

As illustrated in FIG. 4, the TMR element 1 includes the stack portion ST and the side wall portion 17 that is disposed on the side surface of the stack portion ST. The stack portion ST is configured with a plurality of layers that are stacked along the Z-axis direction which is a stack direction. The stack portion ST includes a magnetic tunnel junction 2 and a cap layer 12. The magnetic tunnel junction 2 is disposed on a base layer 21 on the via interconnect part 25. The cap layer 12 is disposed on the magnetic tunnel junction 2 and the side wall portion 17. The cap layer 12 includes a conductive material, and includes a migration preventing layer 14. The cap layer 12 constitutes one end of the TMR element 1. An upper electrode layer 31 is disposed on the cap layer 12. The magnetic tunnel junction 2 is electrically connected to the upper electrode layer 31 via the cap layer 12. The upper electrode layer 31 is electrically connected to the bit line BL (refer to FIG. 3). For example, the upper electrode layer 31 can include a chemical element such as Al or Cu. The interlayer insulation layer 27 is disposed on the side surface of each of the via interconnect part 25 and the base layer 21.

The TMR element 1 includes a first region A1 and a second region A2 that surrounds the first region A1. The first region A1 is positioned immediately above the top surface of the magnetic tunnel junction, and the second region A2 is positioned immediately above the surface of the side wall portion. A boundary B1 between the first region A1 and the second region A2 includes a side part 4e that is positioned in the end portion of a top surface 4 of the magnetic tunnel junction 2.

The cap layer 12 includes an upper surface 16 and a lower surface 18. The upper surface 16 has a protruding shape that protrudes along a direction (Z-axis direction) away from the magnetic tunnel junction 2 in the first region A1. That is, the upper surface 16 has the shape in which the height from the top surface 4 is increased in a direction from a peripheral region 2E of the top surface 4 of the magnetic tunnel junction 2 toward a central region 2L of the top surface 4 in the first region A1. In the cap layer 12, for example, the height of the upper surface 16 from the top surface 4 can have a maximum height H1 in a central part 4c of the top surface 4 and the vicinity of the central part 4c, and can have a minimum height H2 in the side part 4e of the top surface 4 and the vicinity of the side part 4e. In the first embodiment, in the first region A1, the maximum height H1 has a value in a range of, for example, 50 to 100 nm, and the minimum height H2 has a value in a range of, for example, 10 to 50 nm.

In the first region A1, the lower surface 18 of the cap layer 12 has the minimum height that is approximately the same as the height of the top surface 4 of the magnetic tunnel junction 2. The minimum height is defined as the minimum distance to the lower surface 18 from a reference plane SP1 that includes the top surface 4 of the magnetic tunnel junction 2. The minimum height is almost 0 nm. In the second region A2, the height of the lower surface 18 is gradually increased in a direction away from the side part 4e of the top surface 4. The lower surface 18 has a maximum height H3 in a first lower surface area 30. The maximum height H3 is above the reference plane SP1 that includes the top surface 4 of the magnetic tunnel junction 2. The maximum height H3 is defined as the maximum distance from the reference plane SP1 to the lower surface 18. The maximum height H3 has a value in a range of, for example, 10 to 50 nm. Consequently, in the second region A2, the lower surface 18 has a part in which the height of the lower surface 18 is greater than that in the first region A1. The lower surface 18 can have an approximately constant height outside the first lower surface area 30.

In the cap layer 12, the height of the upper surface 16 from the reference plane SP1 in the first region A1 is greater than that of the lower surface 18 from the reference plane SP1 on a surface 19 of the side wall portion 17. That is, the height of the upper surface 16 in the first region A1 is greater than that the lower surface 18 in the second region A2. The difference between the height of the upper surface 16 and the height of the lower surface 18 is, for example, 20 to 100 nm. More preferably, the difference between the height of the upper surface 16 and the height of the lower surface 18 is, for example, 60 to 100 nm.

In the cap layer 12, in the second region A2, the upper surface 16 includes a recess 20 that is recessed along a direction (Z-axis direction) toward the side wall portion 17. In the second region A2, the height of the upper surface 16 is decreased in a direction away from the side part 4e of the top surface 4, and is increased in a direction away from the side part 4e of the top surface 4 from the recess 20 to the first lower surface area 30 that is positioned outside the recess 20. The height of the upper surface 16 is, for example, approximately constant outside a first upper surface area 22. In the first embodiment, a distance D1 of the recess 20 from the boundary B1 is, for example, 10 to 20 nm. More preferably, the distance D1 is, for example, 10 to 15 nm.

In the TMR element 1, in the second region A2, the upper surface 16 of the cap layer 12 includes the recess 20 that is recessed along the direction toward the side wall portion 17. While an electric field is easily concentrated in the recess, the recess 20 is present in a position away from the first region A1 that is positioned immediately above the top surface 4 of the magnetic tunnel junction 2. Thus, an electric field is not easily concentrated in the magnetic tunnel junction 2, and the metal chemical element such as Al or Cu included in the upper electrode layer 31 is not easily subjected to migration caused by a high electric field. The operation of the TMR element 1 can stably continue for a long period. The height of the upper surface 16 of the cap layer 12 in the first region A1 is greater than the height of the lower surface 18 of the cap layer 12 in the second region A2. The difference between the height of the upper surface 16 and the height of the lower surface 18 can cause the cap layer 12 in the first region A1 to have a thickness that can suppress the migration of the chemical element constituting the upper electrode layer 31 to the magnetic tunnel junction 2.

In the cap layer 12, the thickness of the cap layer 12 in the first region A1 can be greater than the thickness of the cap layer 12 in the second region A2. The thickness of the cap layer 12 is, for example, 80 to 150 nm in the first region A1 and, for example, 20 to 100 nm in the second region A2. In the TMR element 1, the cap layer 12 in the first region A1 can have a thickness that can further suppress the migration of the chemical element constituting the upper electrode layer 31 to the magnetic tunnel junction 2.

The migration preventing layer 14 can include a heavy metal of atomic number 39 or greater, specifically, a heavy metal such as Ta, W, or Ru. Since the migration of the heavy metal does not easily occur, the cap layer 12 can suppress the migration of the chemical element constituting the upper electrode layer 31 to the magnetic tunnel junction 2, and can reduce the migration of the chemical element included in the cap layer 12 to the magnetic tunnel junction 2.

The cap layer 12 can further include a sublayer 15. The sublayer 15 forms a stack body with the migration preventing layer 14. The sublayer 15 can be in contact with the magnetic tunnel junction 2, and the migration preventing layer 14 can be in contact with the upper electrode layer 31. The thickness of the sublayer 15 is, for example, 20 to 50 nm in the first region A1. The sublayer 15 includes, for example, Ru, Ta, or W. The thickness of the migration preventing layer 14 is, for example, 20 to 50 nm in the first region A1. In the TMR element 1, since the migration preventing layer 14 is in contact with the upper electrode layer 31, the migration preventing layer 14 causes the cap layer 12 to suppress the migration of the chemical element constituting the upper electrode layer 31 to the magnetic tunnel junction 2. In addition to this suppression, since the sublayer 15 is in contact with the magnetic tunnel junction 2, the cap layer 12 is electrically connected to the magnetic tunnel junction 2.

The cap layer 12 can include a plurality of the stack bodies of the sublayer 15 and the migration preventing layer 14. Consequently, for example, the cap layer 12 has a configuration in which the migration preventing layer 14 and the sublayer 15 are alternately stacked. Each stack body may partially have a configuration in which the migration preventing layer 14 and the sublayer 15 are not alternately stacked, for example, a configuration in which the migration preventing layer 14 of one stack body is in contact with the sublayer 15 of another stack body.

One migration preventing layer 14 included in the stack bodies can be in contact with the upper electrode layer 31, and one sublayer 15 included in the stack bodies can be in contact with the magnetic tunnel junction 2. In the TMR element 1, the plurality of stack bodies further suppress the migration of the chemical element constituting the upper electrode layer 31 to the magnetic tunnel junction 2, and electrically connect the cap layer 12 to the magnetic tunnel junction 2.

In the cap layer 12, the sublayer 15 can include Ta. In the TMR element 1, since the sublayer 15 including Ta is in contact with the magnetic tunnel junction 2, the cap layer 12 further suppresses the migration of the chemical element constituting the upper electrode layer 31 to the magnetic tunnel junction 2, and further reduces the migration of the chemical element included in the cap layer 12 to the magnetic tunnel junction 2.

The upper electrode layer 31 can include a heavy metal of atomic number 39 or greater in addition to Al or Cu, specifically, a heavy metal such as Ta, W, or Ru. In the TMR element 1, since the migration of the heavy metal does not easily occur, the migration of the chemical element constituting the upper electrode layer 31 to the magnetic tunnel junction 2 is further suppressed.

The magnetic tunnel junction 2 is, for example, configured by stacking a reference layer 3, a tunnel barrier layer 5, the magnetization free layer 7, and a perpendicular magnetization inducing layer 9 in this order. The reference layer 3 functions as a magnetization fixed layer. Thus, the tunnel barrier layer 5 is stacked along the Z-axis direction between the reference layer 3 and the magnetization free layer 7. The perpendicular magnetization inducing layer 9 is stacked on the side of the magnetization free layer 7 opposite to the tunnel barrier layer 5 side. In the TMR element 1, the magnetization direction of the magnetization free layer 7 can be reversed using a spin-polarized current that flows through the magnetization free layer 7 via the tunnel barrier layer 5.

In the magnetic tunnel junction 2, for example, the side surface of the perpendicular magnetization inducing layer 9 has an inclination such that the width of the perpendicular magnetization inducing layer 9 is monotonously increased in a direction from the boundary between the cap layer 12 and the perpendicular magnetization inducing layer 9 toward the boundary between the perpendicular magnetization inducing layer 9 and the magnetization free layer 7. The magnetization free layer 7 can have a width that is greater than the width of the perpendicular magnetization inducing layer 9.

In the magnetic tunnel junction 2, the reference layer 3 is formed of a ferromagnetic material such as Co, a Co—Fe alloy, or a Co—Fe—B alloy. The magnetization direction of the reference layer 3 is substantially fixed along the Z-axis direction. The thickness of the reference layer 3 in the Z-axis direction can be, for example, greater than or equal to 3 nm and less than or equal to 10 nm. The reference layer 3 can have a structure in which a multilayer film such as Co/Pt or Co/Ni is repeatedly stacked such that the magnetization direction of each magnetic layer is in a perpendicular direction.

Furthermore, the reference layer 3 can have a structure in which magnetic fields that occur in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably configured to induce perpendicular magnetic anisotropy in the magnetization free layer 7 based on the same principle as the perpendicular magnetization inducing layer 9 described later. The reason is that the perpendicular magnetization of the magnetization free layer 7 is more stable, and the film thickness of the magnetization free layer 7 can be increased. For example, the material constituting the tunnel barrier layer 5 that may induce perpendicular magnetic anisotropy in the magnetization free layer 7 can be exemplified by MgO, ZnO, $GaO_X$, or an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of $AlN_X$, $Cu(In_{0.8}Ga_{0.2})Se_2$, or the like.

The thickness in the Z-axis direction of the tunnel barrier layer 5 is small such that a tunnel current flows through the tunnel barrier layer 5 in the Z-axis direction when a voltage is applied between the reference layer 3 and the magnetization free layer 7. The thickness of the tunnel barrier layer 5 in the Z-axis direction can be, for example, greater than or equal to 1 nm and less than or equal to 3 nm.

In the first embodiment, the tunnel barrier layer 5 is formed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the perpendicular magnetization inducing layer 9 described later. When the easy magnetization axis of the magnetization free layer 7 can be sufficiently stably directed in the direction along the Z axis by the action and the like of the perpendicular magnetization inducing layer 9, the tunnel barrier layer 5 may be formed of a material that does not induce perpendicular magnetic anisotropy in the magnetization free layer 7.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

The perpendicular magnetization inducing layer 9 is, for example, formed of MgO, ZnO, $Ga_2O_3$, or an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

The perpendicular magnetization inducing layer 9 is preferably configured such that the resistance value of the perpendicular magnetization inducing layer 9 along the Z-axis direction per unit area in the XY plane is smaller than that of the tunnel barrier layer 5. Particularly, when the perpendicular magnetization inducing layer 9 is formed of an insulation material, the thickness in the Z-axis direction of the perpendicular magnetization inducing layer 9 is preferably smaller than the thickness in the Z-axis direction of the tunnel barrier layer 5.

The perpendicular magnetization inducing layer 9 is formed of a material that induces magnetic anisotropy (perpendicular magnetic anisotropy) in the direction along the Z axis in a region of the magnetization free layer 7 in the vicinity of the interface between the magnetization free layer 7 and the perpendicular magnetization inducing layer 9 based on the spin-orbit interaction. Accordingly, the perpendicular magnetization inducing layer 9 imparts magnetic anisotropy in the direction (perpendicular direction) along the Z axis to the magnetization free layer 7 in cooperation with the tunnel barrier layer 5.

The magnetic tunnel junction 2 may not include the perpendicular magnetization inducing layer 9. In this case, the magnetization direction of the reference layer 3 may be fixed in a direction (in-plane direction; that is, a direction parallel to the XY plane) that intersects with the stack direction, and the easy magnetization axis of the magnetization free layer 7 may be set in the in-plane direction.

The thickness in the Z-axis direction of the magnetization free layer 7 is small such that the easy magnetization axis of the magnetization free layer 7 is stably set in the direction along the Z axis by the function of imparting magnetic anisotropy exhibited by the tunnel barrier layer 5 and the perpendicular magnetization inducing layer 9 as described above. The thickness can be, for example, greater than or equal to 1 nm and less than or equal to 3 nm.

In the TMR element 1, as described above, since the easy magnetization axis of the magnetization free layer 7 is set in the direction along the Z axis, and the magnetization direction of the reference layer 3 is substantially the direction along the Z-axis direction, the magnetization direction of the reference layer 3 is parallel or antiparallel to the magnetization direction of the magnetization free layer 7 when the magnetization free layer 7 is not substantially affected by an external magnetic field or an STT. The stack portion ST in a state where the magnetization directions of the reference layer 3 and the magnetization free layer 7 are parallel to each other has a different electrical resistance value in the Z-axis direction from that of the stack portion ST in a state where the magnetization directions of the reference layer 3 and the magnetization free layer 7 are antiparallel to each other. Thus, these two states respectively correspond to "1" and "0" that are data of the memory cell of the MRAM 100.

The magnetization direction of the magnetization free layer 7 is reversed (that is, data is written into the memory cell in the MRAM 100) by spin injection magnetization reversal. Specifically, when the magnetization direction of the magnetization free layer 7 is reversed to a parallel state from an antiparallel state with respect to the magnetization direction of the reference layer 3, a voltage is applied between one end and the other end in the Z-axis direction of the stack portion ST such that the tunnel current flows through the tunnel barrier layer 5 in a direction from the magnetization free layer 7 toward the reference layer 3 (that is, spin-polarized electrons move toward the magnetization free layer 7 from the reference layer 3). Accordingly, from the spin-polarized electrons, the magnetization free layer 7 receives a spin transfer torque in a direction in which the magnetization direction of the magnetization free layer 7 rotates toward a parallel state from an antiparallel state with respect to the magnetization direction of the reference layer 3. The magnetization direction of the magnetization free layer 7 is reversed by setting the magnitude of the voltage to be higher than or equal to the threshold that causes spin injection magnetization reversal.

Conversely, when the magnetization direction of the magnetization free layer 7 is reversed to an antiparallel state from a parallel state with respect to the magnetization direction of the reference layer 3, a voltage is applied between one end and the other end in the Z-axis direction of the stack portion ST such that the tunnel current flows through the tunnel barrier layer 5 in a direction from the reference layer 3 toward the magnetization free layer 7 (that is, spin-polarized electrons move toward the reference layer 3 from the magnetization free layer 7). Accordingly, from the spin-polarized electrons, the magnetization free layer 7 receives a spin transfer torque in a direction in which the magnetization direction of the magnetization free layer 7 rotates toward an antiparallel state from a parallel state with respect to the magnetization direction of the reference layer 3. The magnetization direction of the magnetization free layer 7 is reversed by setting the magnitude of the voltage to be higher than or equal to the threshold that causes spin injection magnetization reversal.

In the TMR element 1, the via interconnect part 25 is formed of a conductive material. The via interconnect part 25 is, for example, formed of a metal such as Cu. The base layer 21 is formed of a conductive material. The base layer 21 is, for example, formed of a conductive oxide, a conductive nitride, a conductive oxynitride, or a silicide. Thus, the lower surface of the reference layer 3 that is one end of the TMR element 1 of the first embodiment is electrically connected to the drain D (refer to FIG. 3) of the transistor T through the base layer 21 and the via interconnect part 25.

The base layer 21 is disposed in order to improve the flatness of each layer of the stack portion ST, particularly, the tunnel barrier layer 5. Thus, the flatness of the upper surface of the base layer 21 is set to be higher than the flatness of the upper surface of the via interconnect part 25. The upper surface of the base layer 21 has high flatness and extends along the XY plane. The stack portion ST is formed on the upper surface of the base layer 21. The via interconnect part 25 and the base layer 21 are embedded in the interlayer insulation layer 27 and, by the interlayer insulation layer 27, are electrically insulated from the via interconnect parts and the base layers that are electrically connected to the other TMR elements 1.

The side wall portion 17 is formed of an insulation material and covers the side surface of the stack portion ST. Accordingly, the side wall portion 17 electrically insulates the stack portion ST of the TMR element 1 from the stack portions of the other TMR elements. The side wall portion 17 is, for example, formed of a nitride material such as SiN, or an oxynitride material such as SiON.

Second Embodiment

Figure 5:
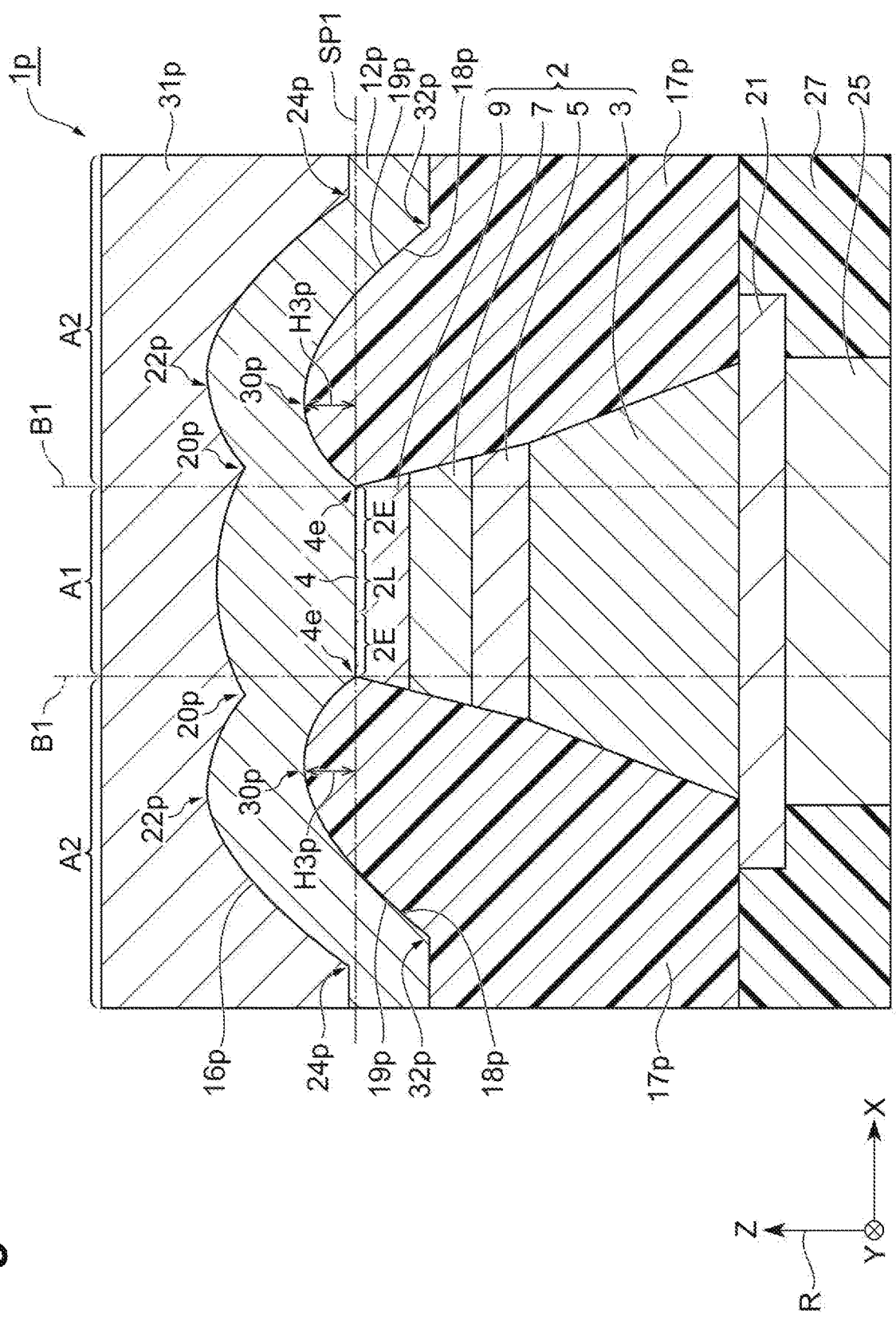
FIG. 5 is a cross-sectional view in the vicinity of a TMR element of an MRAM of a second embodiment.

FIG. 5 is a cross-sectional view in the vicinity of a TMR element of an MRAM of a second embodiment, and corresponds to FIG. 4 in the first embodiment. A TMR element 1p of the second embodiment has the same configuration as the TMR element 1 of the first embodiment except for a cap layer 12p, a side wall portion 17p, and an upper electrode layer 31p. Each of the side wall portion 17p and the upper electrode layer 31p has a configuration that corresponds to the configuration of the cap layer 12p.

In the second embodiment, a lower surface 18p of the cap layer 12p has the minimum height that is approximately the same as the height of the top surface 4 of the magnetic tunnel junction 2 in the first region A1, and the height of the lower surface 18p is gradually increased in a direction away from the side part 4e of the top surface 4 in the second region A2. The lower surface 18p has a maximum height H3p in a first lower surface area 30p. The maximum height H3p is above the reference plane SP1. Consequently, in the second region A2, the lower surface 18p has a part in which the height of the lower surface 18p is greater than that in the first region A1. The height of the lower surface 18p can be decreased in a direction away from the side part 4e of the top surface 4 from the first lower surface area 30p to a second lower surface area 32p that is positioned outside the first lower surface area 30p, and can be below the reference plane SP1. The lower surface 18p can have an approximately constant height outside the second lower surface area 32p.

In the first region A1, the cap layer 12p includes an upper surface 16p that is the same as the upper surface 16 of the first embodiment. The height of the upper surface 16p in the first region A1 is greater than the height of the lower surface 18p in the second region A2. The thickness of the cap layer 12p in the first region A1 can be greater than the thickness of the cap layer 12p in the second region A2.

In the second region A2, the upper surface 16p includes a recess 20p that is recessed in a direction toward the side wall portion 17p. The height of the upper surface 16p is decreased in a direction away from the side part 4e of the top surface 4, and is gradually increased from the recess 20p to a first upper surface area 22p that is positioned outside the recess 20p. The height of the upper surface 16p can be decreased in a direction away from the side part 4e of the top surface 4 from the first upper surface area 22p to a second upper surface area 24p that is positioned outside the first upper surface area 22p. The upper surface 16p can have an approximately constant height outside the second upper surface area 24p.

Third Embodiment

Figure 6:
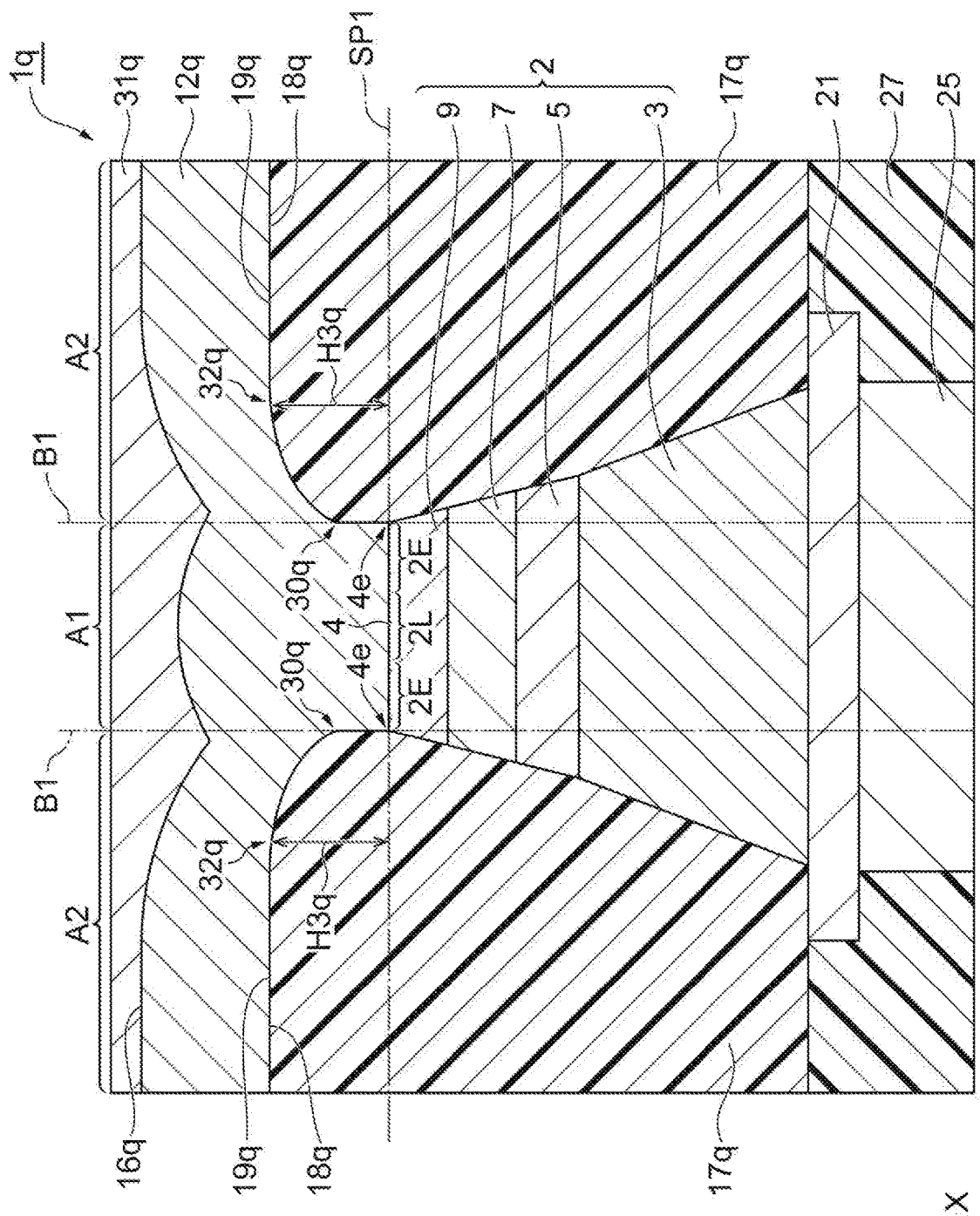
FIG. 6 is a cross-sectional view in the vicinity of a TMR element of an MRAM of a third embodiment.

FIG. 6 is a cross-sectional view in the vicinity of a TMR element of an MRAM of a third embodiment, and corresponds to FIG. 4 in the first embodiment. A TMR element 1q of the third embodiment has the same configuration as the TMR element 1 of the first embodiment except for a cap layer 12q, a side wall portion 17q, and an upper electrode layer 31q. Each of the side wall portion 17q and the upper electrode layer 31q has a configuration that corresponds to the configuration of the cap layer 12q.

In the third embodiment, a lower surface 18q of the cap layer 12q has the minimum height that is approximately the same as the height of the top surface 4 of the magnetic tunnel junction 2 in the first region A1, and the height of the lower surface 18q on the side part 4e of the top surface 4 in the second region A2 is increased until reaching a first lower surface area 30q of the lower surface 18q. The height of the lower surface 18q can be monotonously increased from the first lower surface area 30q to a second lower surface area 32q that is positioned outside the first lower surface area 30q. The lower surface 18q can have a maximum height H3q in the second lower surface area 32q. The maximum height H3q is above the reference plane SP1. Consequently, in the second region A2, the lower surface 18q has a part in which the height of the lower surface 18q is greater than that in the first region A1. The lower surface 18q can have an approximately constant height outside the second lower surface area 32q.

In the first region A1 and the second region A2, the cap layer 12q includes an upper surface 16q that is the same as the upper surface 16 of the first embodiment. The height of the upper surface 16q in the first region A1 is greater than the height of the lower surface 18q in the second region A2. The thickness of the cap layer 12q in the first region A1 can be greater than that of the cap layer 12q in the second region.

Fourth Embodiment

Figure 7:
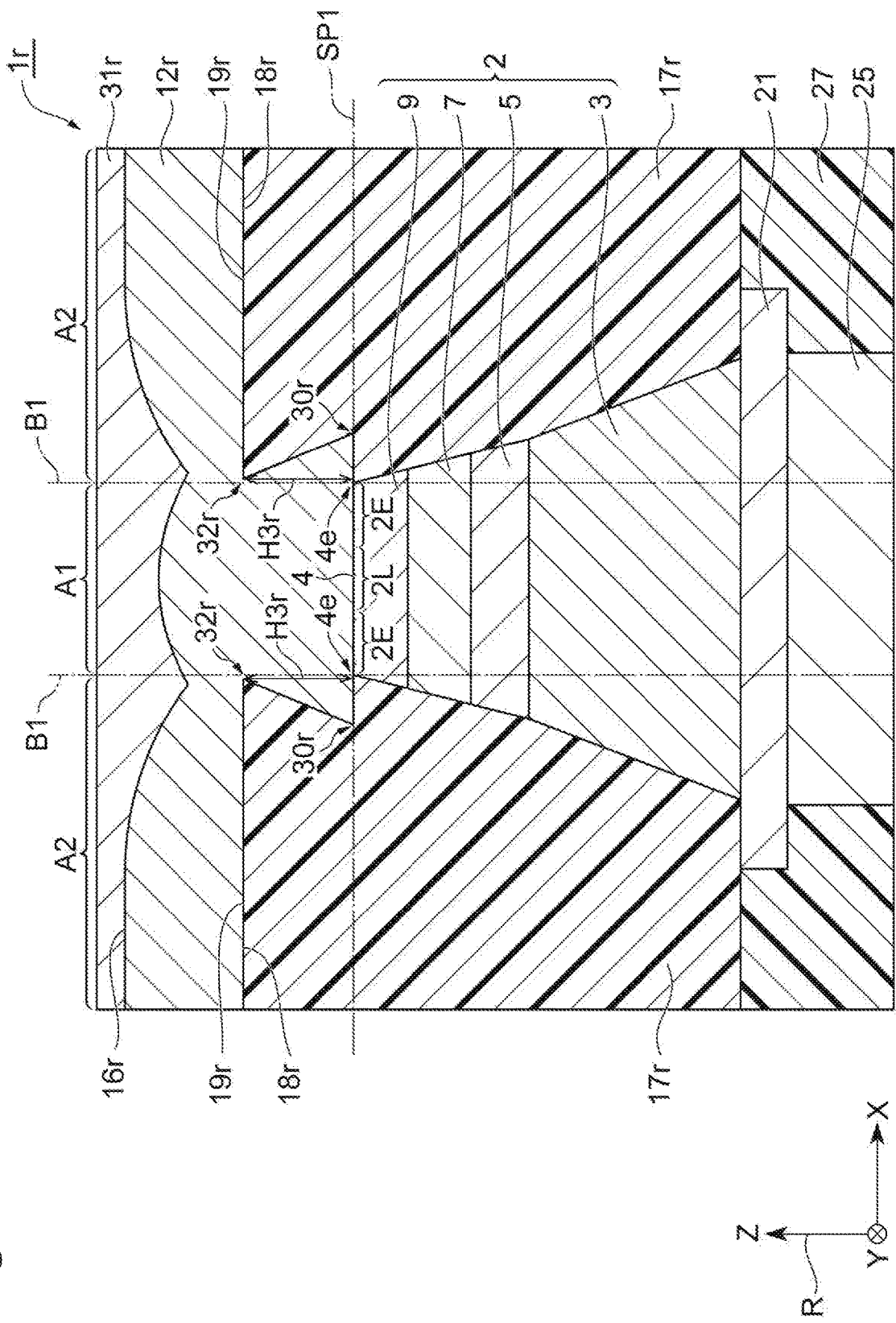
FIG. 7 is a cross-sectional view in the vicinity of a TMR element of an MRAM of a fourth embodiment.

FIG. 7 is a cross-sectional view in the vicinity of a TMR element of an MRAM of a fourth embodiment, and corresponds to FIG. 4 in the first embodiment. A TMR element 1r of the fourth embodiment has the same configuration as the TMR element 1 of the first embodiment except for a cap layer 12r, a side wall portion 17r, and an upper electrode layer 31r. Each of the side wall portion 17r and the upper electrode layer 31r has a configuration that corresponds to the configuration of the cap layer 12r.

In the fourth embodiment, a lower surface 18r of the cap layer 12r has the minimum height that is approximately the same as the height of the top surface 4 of the magnetic tunnel junction 2 in the first region A1, and has a height that is almost the same as the minimum height from the side part 4e of the top surface 4 to a first lower surface area 30r of the lower surface 18r in the second region A2. The height of the lower surface 18r can be monotonously increased from the first lower surface area 30r to a second lower surface area 32r that is positioned inside the first lower surface area 30r. The lower surface 18r can have a maximum height H3r in the second lower surface area 32r. The maximum height H3r is above the reference plane SP1. Consequently, in the second region A2, the lower surface 18r has a part in which the height of the lower surface 18r is greater than that in the first region A1. The lower surface 18r can have an approximately constant height outside the second lower surface area 32r.

In the first region A1 and the second region A2, the cap layer 12r includes an upper surface 16r that is the same as the upper surface 16 of the first embodiment. The height of the upper surface 16r in the first region A1 is greater than the height of the lower surface 18r in the second region A2. The thickness of the cap layer 12r in the first region A1 can be greater than the thickness of the cap layer 12r in the second region.

Fifth Embodiment

Figure 8:
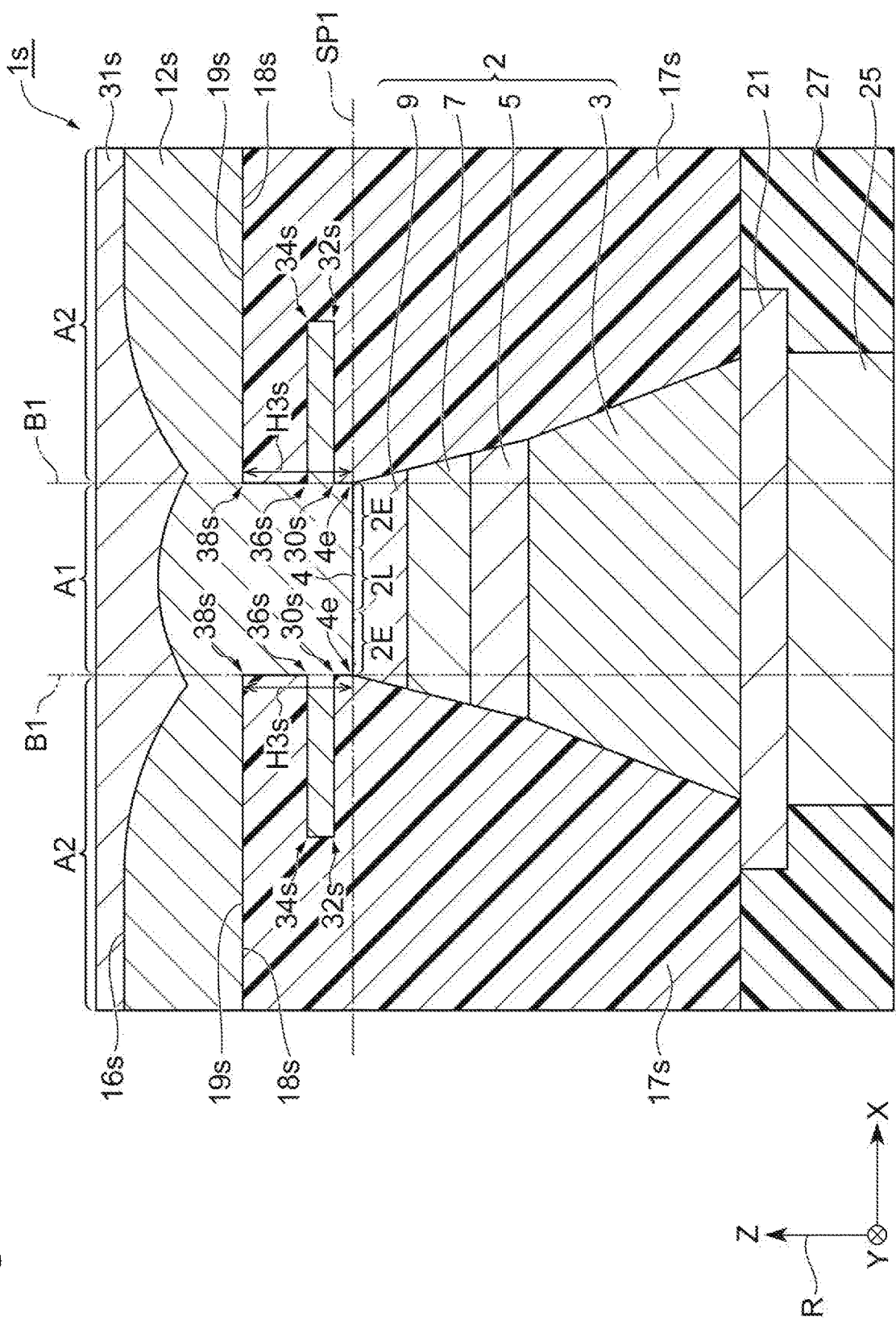
FIG. 8 is a cross-sectional view in the vicinity of a TMR element of an MRAM of a fifth embodiment.

FIG. 8 is a cross-sectional view in the vicinity of a TMR element of an MRAM of a fifth embodiment, and corresponds to FIG. 4 in the first embodiment. A TMR element 1s of the fifth embodiment has the same configuration as the TMR element 1 of the first embodiment except for a cap layer 12s, a side wall portion 17s, and an upper electrode layer 31s. Each of the side wall portion 17s and the upper electrode layer 31s has a configuration that corresponds to the configuration of the cap layer 12s.

In the fifth embodiment, a lower surface 18s of the cap layer 12s has the minimum height that is approximately the same as the height of the top surface 4 of the magnetic tunnel junction 2 in the first region A1, and the height of the lower surface 18s on the side part 4e of the top surface 4 in the second region A2 is increased until reaching a first lower surface area 30s of the lower surface 18s. For example, the lower surface 18s has an approximately constant height from the first lower surface area 30s to a second lower surface area 32s that is positioned outside the first lower surface area 30s. The height of the lower surface 18s on the second lower surface area 32s is increased from the second lower surface area 32s to a third lower surface area 34s that is positioned above the second lower surface area 32s. The lower surface 18s can have a height that is approximately constant as the height in the third lower surface area 34s from the third lower surface area 34s to a fourth lower surface area 36s that is positioned inside the third lower surface area 34s above the first lower surface area 30s. The height of the lower surface 18s on the fourth lower surface area 36s can be increased from the fourth lower surface area 36s to a fifth lower surface area 38s that is positioned above the fourth lower surface area 36s. The lower surface 18s can have a maximum height H3s in the fourth lower surface area 36s. The maximum height H3s is above the reference plane SP1. Consequently, in the second region A2, the lower surface 18s has a part in which the height of the lower surface 18s is greater than that in the first region A1. The lower surface 18s can have an approximately constant height outside the fifth lower surface area 38s.

In the first region A1 and the second region A2, the cap layer 12s includes an upper surface 16s that is the same as the upper surface 16 of the first embodiment. The height of the upper surface 16s in the first region A1 is greater than that of the lower surface 18s in the second region A2. The thickness of the cap layer 12s in the first region A1 can be greater than the thickness of the cap layer 12s in the second region.

Sixth Embodiment

FIG. 9 is a schematic view of a vertical cross-section of an MRAM according to a sixth embodiment. An MRAM 100t according to the sixth embodiment is different from the MRAM 100 of the basic aspect of the first embodiment in that the MRAM 100t further includes a processor 90. In the MRAM 100t, an MRAM part is formed as a part of a step of forming the circuit of the processor 90. Thus, the processor 90 and the MRAM part of the MRAM 100b are integrated. Thus, the MRAM 100t is a built-in memory. Accordingly, the speed of data exchange between the processor 90 and the MRAM part is increased. The MRAM 100t can include the TMR elements illustrated in the first embodiment to the fifth embodiment.

REFERENCE SIGNS LIST

1 TMR ELEMENT
2 MAGNETIC TUNNEL JUNCTION
4 TOP SURFACE
12 CAP LAYER
14 MIGRATION PREVENTING LAYER
15 SUBLAYER
16 UPPER SURFACE
17 SIDE WALL PORTION
18 LOWER SURFACE
19 SURFACE
20 RECESS
31 UPPER ELECTRODE LAYER
A1 FIRST REGION
A2 SECOND REGION

The invention claimed is:
1. A tunnel magnetoresistive effect element comprising:
a magnetic tunnel junction;
a side wall portion disposed on a side surface of the magnetic tunnel junction;

a cap layer covering a top surface of the magnetic tunnel junction and a surface of the side wall portion; and an upper electrode layer disposed on the cap layer, the upper electrode layer including, as a metal chemical element, Al or Cu, wherein the cap layer includes an upper surface and a lower surface, the upper surface has a protruding shape that protrudes in a direction away from the magnetic tunnel junction in a first region which is positioned immediately above the top surface of the magnetic tunnel junction, the upper surface has a recess that can cause an electrical field concentration is recessed in a direction toward the side wall portion in a second region which is positioned immediately above the surface of the side wall portion, in the second region, the lower surface has a part in which a height of the lower surface is greater than the height of the lower surface in the first region, a height of the upper surface in the first region is greater than the height of the lower surface in the second region, the height between the lower surface of the first region and the upper surface of the first region is in a range of from 50 nm to 100 nm, and the cap layer includes a migration preventing layer extending from the first region to the second region, the migration preventing layer configured to prevent migration of the metal chemical element included in the upper electrode layer caused by a high electric field.

2. The tunnel magnetoresistive effect element according to claim 1,
wherein a thickness of the cap layer in the first region is greater than a thickness of the cap layer in the second region.

3. The tunnel magnetoresistive effect element according to claim 2,
wherein the migration preventing layer includes a heavy metal of atomic number 39 or greater.

4. The tunnel magnetoresistive effect element according to claim 2,
wherein the cap layer further includes a sublayer,
the sublayer forms a stack body with the migration preventing layer,
the sublayer is in contact with the magnetic tunnel junction, and
the migration preventing layer is in contact with the upper electrode layer.

5. The tunnel magnetoresistive effect element according to claim 4,
wherein the cap layer includes a plurality of the stack bodies,
one sublayer included in the stack bodies is in contact with the magnetic tunnel junction, and
one migration preventing layer included in the stack bodies is in contact with the upper electrode layer.

6. The tunnel magnetoresistive effect element according to claim 4,
wherein the sublayer includes Ta.

7. The tunnel magnetoresistive effect element according to claim 6,
wherein the sublayer includes Ta.

8. The tunnel magnetoresistive effect element according to claim 2,
wherein the upper electrode layer includes a heavy metal of atomic number 39 or greater.

9. A magnetic memory comprising:
the tunnel magnetoresistive effect element according to claim 2, as a storage element.

10. The tunnel magnetoresistive effect element according to claim 1,
wherein the migration preventing layer includes a heavy metal of atomic number 39 or greater.

11. The tunnel magnetoresistive effect element according to claim 10,
wherein the cap layer further includes a sublayer,
the sublayer forms a stack body with the migration preventing layer,
the sublayer is in contact with the magnetic tunnel junction, and
the migration preventing layer is in contact with the upper electrode layer.

12. The tunnel magnetoresistive effect element according to claim 11,
wherein the cap layer includes a plurality of the stack bodies,
one sublayer included in the stack bodies is in contact with the magnetic tunnel junction, and
one migration preventing layer included in the stack bodies is in contact with the upper electrode layer.

13. The tunnel magnetoresistive effect element according to claim 11,
wherein the sublayer includes Ta.

14. The tunnel magnetoresistive effect element according to claim 13,
wherein the sublayer includes Ta.

15. The tunnel magnetoresistive effect element according to claim 1,
wherein the cap layer further includes a sublayer,
the sublayer forms a stack body with the migration preventing layer,
the sublayer is in contact with the magnetic tunnel junction, and
the migration preventing layer is in contact with the upper electrode layer.

16. The tunnel magnetoresistive effect element according to claim 15,
wherein the cap layer includes a plurality of the stack bodies,
one sublayer included in the stack bodies is in contact with the magnetic tunnel junction, and
one migration preventing layer included in the stack bodies is in contact with the upper electrode layer.

17. The tunnel magnetoresistive effect element according to claim 15,
wherein the sublayer includes Ta.

18. The tunnel magnetoresistive effect element according to claim 1,
wherein the upper electrode layer includes a heavy metal of atomic number 39 or greater.

19. magnetic memory comprising:
the tunnel magnetoresistive effect element according to claim 1, as a storage element.

20. A built-in memory comprising:
the magnetic memory according to claim 19.

* * * * *